United States Patent
Lodhie

(10) Patent No.: US 6,994,461 B2
(45) Date of Patent: Feb. 7, 2006

(54) LED LAMP FOR VEHICLE SIGNAL LIGHT

(76) Inventor: Pervaiz Lodhie, 23105 Kashiwa Ct., Torrance, CA (US) 90505

( * ) Notice: Subject to any disclaimer, the term of this patent is extended or adjusted under 35 U.S.C. 154(b) by 242 days.

(21) Appl. No.: 10/624,131

(22) Filed: Jul. 21, 2003

(65) Prior Publication Data
US 2004/0156213 A1 Aug. 12, 2004

Related U.S. Application Data

(60) Provisional application No. 60/397,114, filed on Jul. 19, 2002.

(51) Int. Cl.
F21V 21/00 (2006.01)

(52) U.S. Cl. .................... 362/545; 362/35; 362/184; 362/249; 362/543; 362/544

(58) Field of Classification Search .............. 362/545, 362/543, 544, 35, 249, 184
See application file for complete search history.

(56) References Cited

U.S. PATENT DOCUMENTS

| | | | | |
|---|---|---|---|---|
| 2,408,643 A | * | 10/1946 | Hoy | 362/184 |
| 6,547,410 B1 | * | 4/2003 | Pederson | 362/35 |
| 6,598,996 B1 | * | 7/2003 | Lodhie | 362/249 |

* cited by examiner

Primary Examiner—Thomas M. Sember
Assistant Examiner—James W Cranson
(74) Attorney, Agent, or Firm—Irving Keschwer

(57) ABSTRACT

An LED lamp has a housing and a plurality of light-emitting diodes (LEDs) arranged to form two different LED arrays. The housing has a pair of openings on opposite sides. Each of the LED arrays corresponds to a different one of the openings of the housing such that at least a portion of each of the LED arrays is exposed through the corresponding opening.

12 Claims, 7 Drawing Sheets

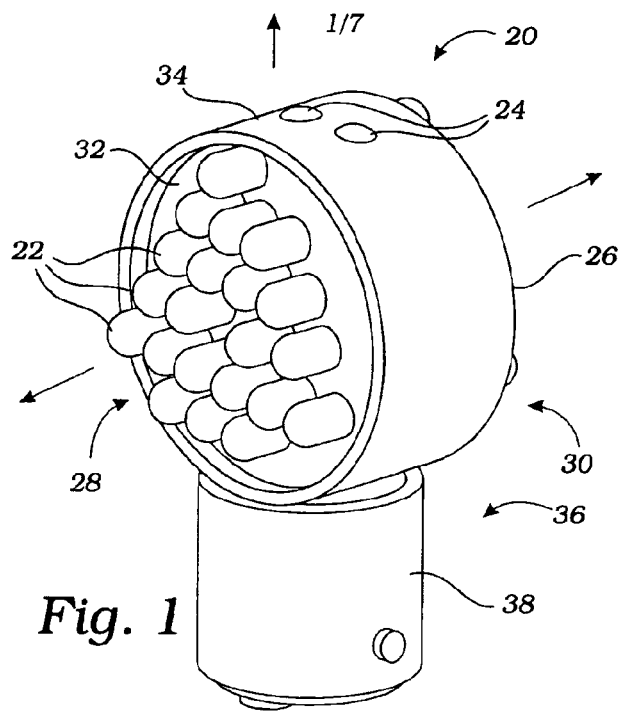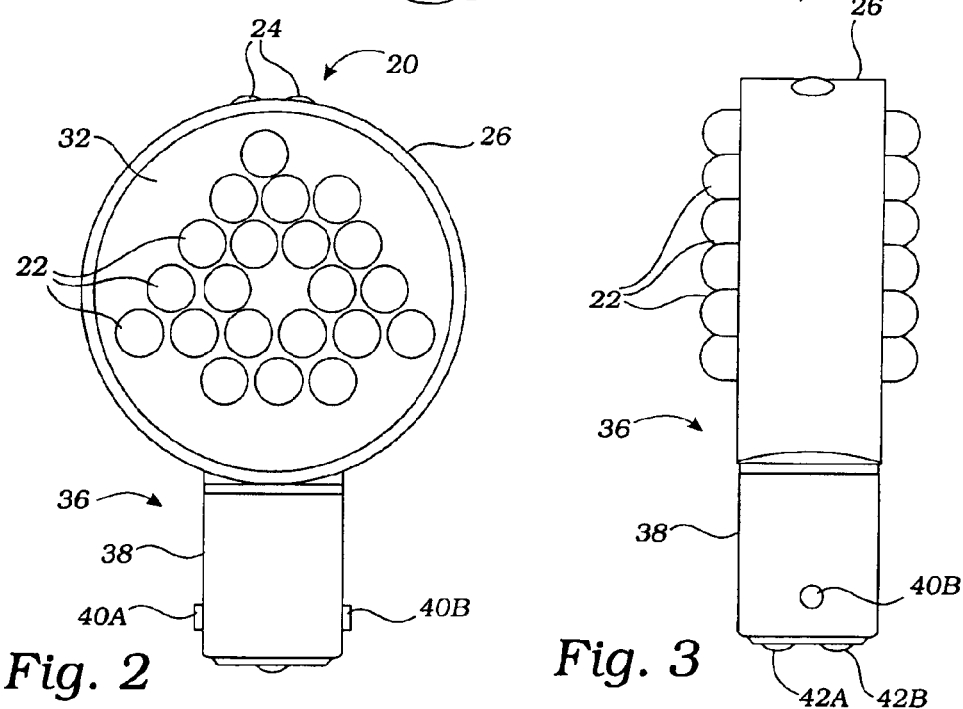

LED LAMP FOR VEHICLE SIGNAL LIGHT

CROSS-REFERENCE TO RELATED APPLICATIONS

This application for a utility patent claims the benefit of U.S. Provisional Application No. 60/397,114, filed Jul. 19, 2002.

BACKGROUND OF THE INVENTION

1. Field of the Invention

This invention relates generally to electrical lamps or bulbs, and more particularly to lamps used on vehicles.

2. Description of Related Art

Signal lights are used on many different types of vehicles to indicate changes in speed and/or direction. For example, signal lights used on motor vehicles include brake lights, tail lights, turn signals, and running lights. Such signal lights typically have replaceable incandescent lamps or bulbs.

The specifications for U.S. motor vehicle signal lights are written by the Society of Automotive Engineers (SAE). These specifications are published in SAE publication HS-34 titled SAE Ground Vehicle Lighting Standards Manual, which is updated annually. The SAE standards for passenger car signal lights include:

SAE J585 "Tail Lamps (Rear Position Lamps) For Use on Motor Vehicles Less Than 2032 mm in Overall Width;"

SAE J586 "Stop Lamps for Use on Motor Vehicles Less Than 2032 mm in Overall Width;"

SAE J588 "Turn Signal Lamps for Use on Motor Vehicles Less Than 2032 mm in Overall Width;" and SAE J1957 "Center High Mounted Stop Lamp Standard for Vehicles Less Than 2032 mm in Overall Width."

A light-emitting diode (LED) is a diode that emits light when a current passes through it. A diode is a semiconductor device through which current can pass in only one direction. LEDs are often used as indicator lights, and are also commonly used in computer system "laser" printers and compact disk read only memory (CD-ROM) drives.

LEDs are in general more efficient, last longer, and are more durable than incandescent light bulbs. LEDs are typically at least 4 times more efficient at generating light than incandescent light bulbs. Unlike incandescent light bulbs, LEDs are extremely shock resistant. While an incandescent light bulb may produce light for 1,000 operating hours, many LEDs can provide 100,000 hours of continuous use. As a result, LEDs are generally preferred over incandescent light bulbs in critical applications.

For example, the additional brake light required by the SAE J1957 standard listed above is commonly referred to as the "third brake light." Many automobile manufacturers are now using LEDs in the third brake light as the fixtures are often inaccessible making lamp replacement extremely difficult.

Railway (i.e. railroad) transportation is popular the world over. In general, a railway includes one or more parallel series of iron or steel rails spaced apart from on another to form tracks for wheels of railway vehicles. Types of railway vehicles include locomotives, carriages, wagons, rail cars, rail motors, light rail vehicles, rail inspection vehicles, and trolleys. Reported benefits of railway transportation over motor vehicle transportation include reduced fuel consumption, improved air quality, reduced transportation costs, reduced traffic congestion, reduced pavement damage, and improved transportation safety.

As cities grow, motor vehicle traffic volumes in and around the cities typically increase. Growing cities often face the problem of accommodating this increased demand at some point. Light rail is one option that promises to reduce motor vehicle traffic congestion. In general, the term "light rail" is used to describe passenger railway vehicles operating singly or in short (e.g., two car) trains on fixed rails. The rails are typically located near motor vehicle roadways. Light rail vehicles are typically driven electrically with electrical power being drawn from an overhead electric line via a trolley or a pantograph. Light rail vehicles are also often called "streetcars," "tramways," or "trolley cars."

As light rail vehicles typically operate near motor vehicles, they often include electrical signal lights similar to those used on motor vehicles. Such signal lights include brake lights, tail lights, turn signals, and running lights.

SUMMARY OF THE INVENTION

The present invention teaches certain benefits in construction and use which give rise to the objectives described below.

The present invention provides an LED lamp having a housing and a plurality of light-emitting diodes (LEDs) arranged to form two different LED arrays. The housing has a pair of openings on opposite sides. Each of the LED arrays corresponds to a different one of the openings of the housing such that at least a portion of each of the LED arrays is exposed through the corresponding opening.

A primary objective of the present invention is to provide an LED lamp having advantages not taught by the prior art.

Another objective is to provide an LED lamp that replaces existing lamps while meeting all necessary vehicle lighting standards.

A further objective is to provide an LED lamp that is both durable and energy efficient.

Other features and advantages of the present invention will become apparent from the following more detailed description, taken in conjunction with the accompanying drawings, which illustrate, by way of example, the principles of the invention.

BRIEF DESCRIPTION OF THE DRAWING

The accompanying drawings illustrate the present invention. In such drawings:

FIG. 1 is a perspective view of one embodiment of a lamp including multiple light-emitting diodes (LEDs) exposed through various openings in a housing, wherein the lamp includes multiple printed circuit boards (PCBs);

FIG. 2 is a front view of the lamp of FIG. 1;

FIG. 3 is a side view of the lamp of FIG. 1;

DETAILED DESCRIPTION OF THE INVENTION

Figure 4:
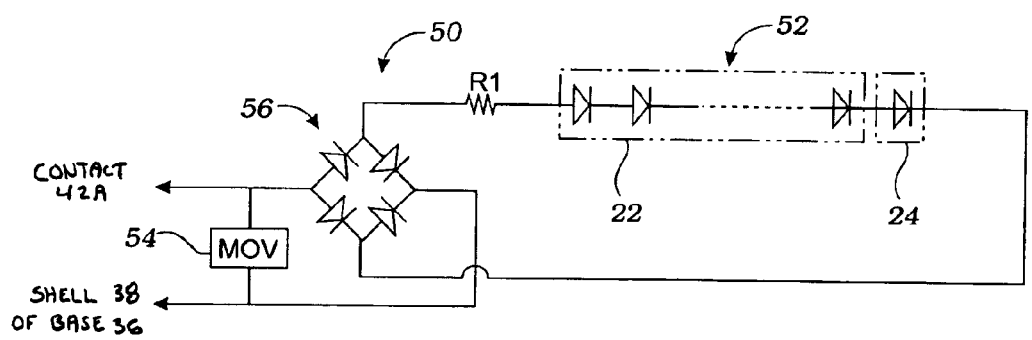
FIG. 4 is a diagram of one embodiment of an electrical circuit for illuminating LEDs forming one of two LED arrays of the lamp of FIG. 1.

FIG. 1 is a perspective view of one embodiment of a lamp 20 including multiple light-emitting diodes (LEDs) exposed through various openings in a housing 26. The housing 26 is essentially a hollow cylinder having two major openings 28 and 30 on opposite sides. The LEDs of the lamp 20 are arranged to form two different arrays, and each of the arrays is mounted to a different one of two printed circuit boards (PCBs). Portions of the LEDs forming the LED arrays are exposed through the major openings 28 and 30.

The LEDs of the lamp 20 include LEDs 22 and 24 shown in FIG. 1. The LEDs 22 are part of one of the two LED arrays. The LEDs 22 are mounted to a PCB 32 and exposed through the major opening 28.

At least one LED, preferably two LEDs 24 are exposed through corresponding holes in a side surface 34 of the housing 26 such that the two LEDs 24 are generally orthogonal to the LEDs 22. While we discuss the present embodiment that includes two LEDs 24, obviously this term should be defined to include any number of LEDs that are functionally equivalent to the embodiment shown. In one embodiment, one of the two LEDs 24 is part of the LED array including the LEDs 22, and is mounted to the PCB 32. The other LED 24 is a part of the other LED array and is mounted to the other PCB.

The housing 26 is preferably formed from a hard plastic material. A suitable hard plastic material is the Rynite® polyethylene terephthalate (PET) thermoplastic polyester resin material manufactured by the E.I. du Pont de Nemours and Company, Wilmington, Del.

The lamp 20 includes a base 36 connected to the side surface 34 of the housing 26 opposite the LEDs 24. The base 36 includes a generally cylindrical shell 38 and one or more other electrical contacts for receiving electrical power. In the embodiment of FIG. 1, the base 36 is a double contact bayonet base adapted for connecting to a bayonet-type lamp holder or socket. When properly inserted into the bayonet-type lamp holder or socket, the bayonet base 36 provides both electrical contact and structural support the lamp 20. Such bayonet bases are advantageous in applications where vibration or corrosion are factors. Other embodiments of the lamp 20 may include other types of bases.

The shell 38 of the base 36 is essentially a hollow cylinder, and is preferably made of a metal. In one embodiment, the shell 38 is made of brass. The brass shell 38 may be plated with nickel to prevent corrosion. When the bayonet base 36 is inserted into the lamp holder or socket, the shell 38 forms a common or "ground" electrical contact between the lamp 20 and the lamp holder or socket.

As illustrated in FIG. 1, the lamp 20 produces light in 3 different directions: from the major openings 28 and 30 on the opposite sides of the housing 26, and from the holes in the side surface 34 of the housing 26 opposite the base 36.

In one embodiment, all of the LEDs of the lamp 20 emit the same color of visible light—either red, yellow, or blue. In other embodiments the LEDs of each of the two LED arrays of the lamp 20 may emit the same or different colors of visible light.

When the LEDs of the lamp 20 emit red light, the red light has a wavelength between about 620 nanometers and approximately 680 nanometers. In one embodiment, the red light emitted by the LEDs has a wavelength of about 633 nanometers.

When the LEDs of the lamp 20 emit yellow light, the yellow light has a wavelength between about 540 nanometers and approximately 600 nanometers. In one embodiment, the yellow light emitted by the LEDs has a wavelength of about 595 nanometers.

When the LEDs of the lamp 20 emit blue light, the blue light has a wavelength between about 425 nanometers and approximately 490 nanometers. In one embodiment, the blue light emitted by the LEDs has a wavelength of about 430 nanometers.

FIG. 2 is a front view of the lamp 20 of FIG. 1. Shown in FIG. 2 are lugs 40A and 40B attached to opposite sides of an outer surface of the cylindrical shell 38 of the base 36. The lugs 40A–40B fit into corresponding slots in the lamp holder or socket. When the base 36 is properly inserted into the lamp holder or socket, spring tension between the base 36 and the lamp holder or socket provides structural support the lamp 20.

In the embodiment of FIGS. 1–2, the LEDs 22 mounted to the PCB 32 are arranged in a substantially triangular pattern. In other embodiments the LEDs 22 may be arranged in other patterns, including (but not limited to) square, pentagonal, and hexagonal patterns.

FIG. 3 is a side view of the lamp 20 of FIG. 1. Shown in FIG. 3 are contacts 42A and 42B of the base 36 for receiving electrical power. The contacts 42A–42B are electrically insulated from the cylindrical shell 38 of the base 36.

In one embodiment, the contact 42A and the shell 38 provide electrical power to one of the two LED arrays and the corresponding PCB of the lamp 20, and the contact 42B and the shell 38 provide electrical power to the other LED array and the other PCB.

FIG. 4 is a diagram of one embodiment of an electrical circuit 50 for illuminating LEDs 52 forming one of the LED arrays of the lamp 20 of FIG. 1. As shown in FIG. 4, the LEDs 52 include the LEDs 22 of FIGS. 1 and 2 and one of the LEDs 24 of FIG. 1. The LEDs 52 are mounted to the PCB 32 of FIG. 1. In the embodiment of FIG. 4 the electrical circuit 50 includes a metal oxide varistor (MOV) 54, a diode array 56, and a resistor "R1." The resistor R1 and the diode array 56 provide electrical voltage and current to the LEDs 52 to properly illuminate the LEDs 52 independent of the polarity of an input direct current (dc) voltage applied between the contact 42A and the shell 38 of the base 36 of FIG. 3. The MOV 54 provides electrical power surge protection for components of the circuit 50.

In one embodiment, 76 volts dc (vdc) is applied between the contact 42A and the shell 38 of the base 36 of FIG. 3, and the LEDs 52 mounted on the PCB 32 of FIG. 1 and forming one of the LED arrays of the lamp 20 of FIGS. 1 and 2 include 21 LEDs connected in series. The resistor R1 is valued to achieve an electrical current through the LEDs 52 to properly illuminate the LEDs 52.

Figure 5:
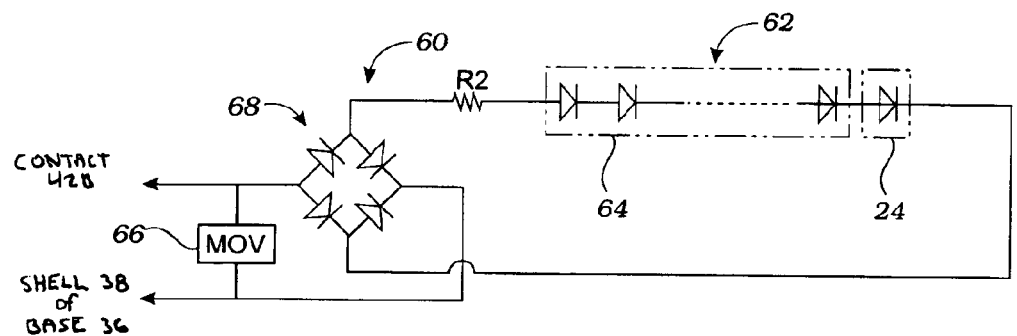
FIG. 5 is a diagram of one embodiment of an electrical circuit for illuminating LEDs forming the other LED array of the lamp of FIG. 1.

FIG. 5 is a diagram of one embodiment of an electrical circuit 60 for illuminating an array 62 of LEDs forming the other LED array of the lamp 20 of FIG. 1. As shown in FIG. 5, LED array 62 include LEDs 64 exposed through the opening 30 of FIG. 1 and the other LED 24 of FIG. 1. In the embodiment of FIG. 5 the electrical circuit 60 includes an MOV 66, a diode array 68, and a resistor "R2." The resistor R2 and the diode array 68 provide electrical voltage and current to the LEDs 62 to properly illuminate the LEDs 62 independent of the polarity of an input dc voltage applied between the contact 42B and the shell 38 of the base 36 of FIG. 3. The MOV 66 provides electrical power surge protection for components of the circuit 60.

In one embodiment, 76 volts dc (VDC) is applied between the contact 42B and the shell 38 of the base 236 of FIG. 3, and the LED array 62 mounted on the other PCB and forming the other LED array of the lamp 20 of FIG. 1 include 21 LEDs in series. The LEDs 64 include 21 LEDs connected in series. The resistor R2 is valued to achieve and electrical current through the LEDs 62 to properly illuminate the LEDs 62.

Figure 6:
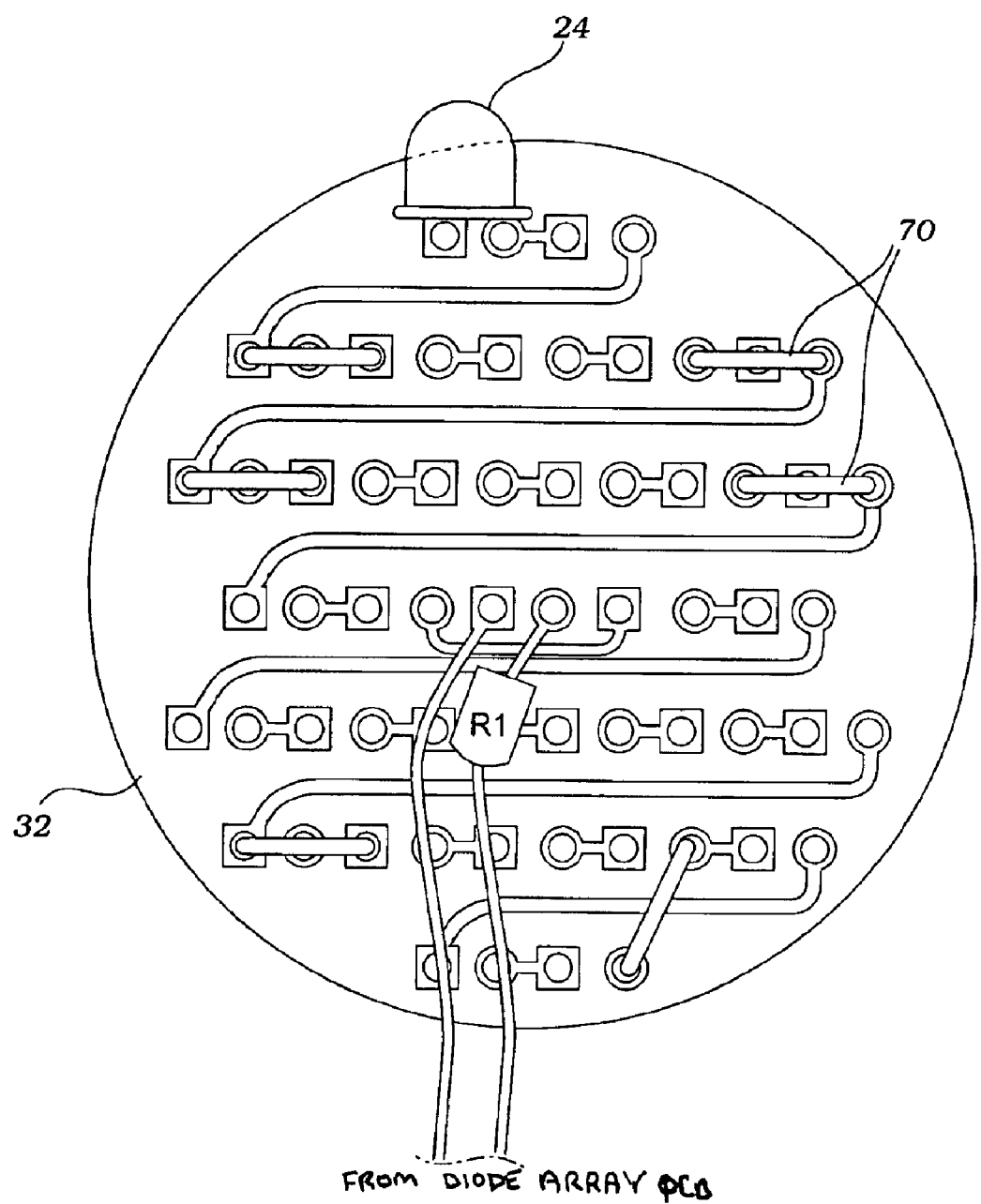
FIG. 6 is diagram of one embodiment of a PCB to which the LEDs of FIG. 4 are mounted.

FIG. 6 is diagram of one embodiment of the PCB 32 of FIG. 1 to which the LEDs 52 of FIG. 4 are mounted. As described above, the LEDs 52 of FIG. 4 form one of the two LED arrays of the lamp 20 of FIG. 1 and include the LEDs 22 of FIG. 1 and one of the LEDs 24 of FIG. 1. Electrical power is provided to the PCB 32 from the base 36 of FIGS. 1–3 via a separate diode array PCB and the resistor R1. Several jumpers 70 are illustrated in FIG. 6. The LEDs 62 of FIG. 5 forming the other LED array of the lamp 20 are mounted to a similar PCB.

Figure 7:
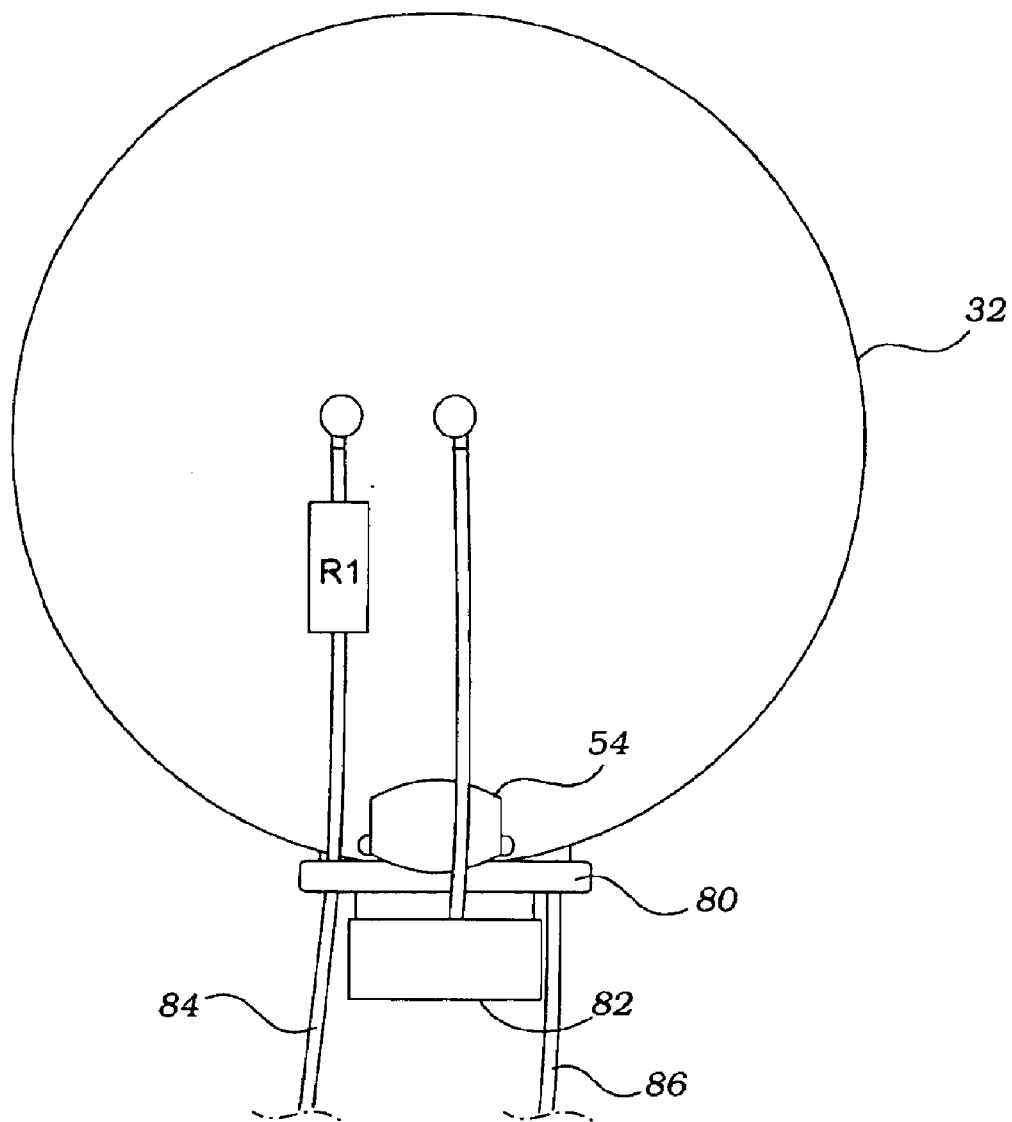
FIG. 7 is diagram of the PCB of FIGS. 1 and 6 wherein the PCB is connected to a first diode array PCB.

FIG. 7 is diagram of the PCB 32 of FIGS. 1 and 6 wherein the PCB 32 is connected to a diode array PCB 80. As described above, electrical power is provided to the PCB 32 from the base 36 of FIGS. 1–3 via the diode array PCB 80 and the resistor R1. As illustrated in FIG. 7 the MOV 54 of FIG. 4 and a bridge rectifier device 82 are mounted to the diode array PCB 80. The bridge rectifier device 82 includes the diode array 56 of FIG. 4. The diode array PCB 80 is located in the base 36. A wire 84 connects the diode array PCB 80 to the contact 42A of the base 36 of FIG. 3, and a wire 86 connects the diode array PCB 80 to the shell 38 of the base 36.

Figure 8:
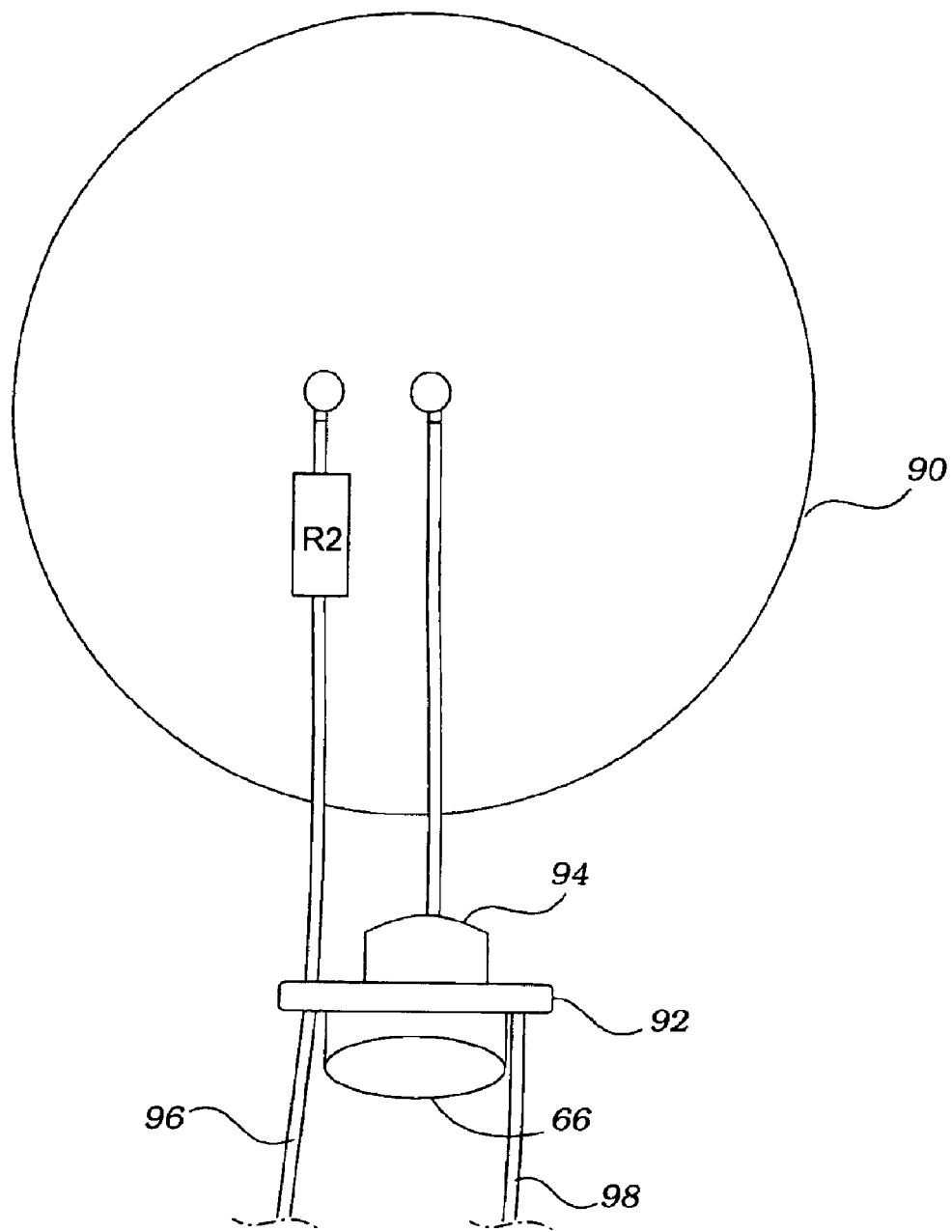
FIG. 8 is diagram of another PCB to which the LEDs of FIG. 5 are mounted, wherein the other PCB is connected to a second diode array PCB.

FIG. 8 is diagram of a PCB 90 to which the LEDs 62 of FIG. 5 are mounted. As illustrated in FIG. 8 the PCB 90 is connected to a diode array PCB 92 similar to the diode array PCB 80 of FIG. 7. Electrical power is provided to the PCB 90 from the base 36 of FIGS. 1–3 via the diode array PCB 92 and the resistor R2. As illustrated in FIG. 8 the MOV 66 of FIG. 5 and a bridge rectifier device 94 are mounted to the diode array PCB 92. The bridge rectifier device 94 includes the diode array 68 of FIG. 5. The diode array PCB 92 is located in the base 36. A wire 96 connects the diode array PCB 92 to the contact 42B of the base 36 of FIG. 3, and a wire 98 connects the diode array PCB 92 to the shell 38 of the base 36.

Figure 9:
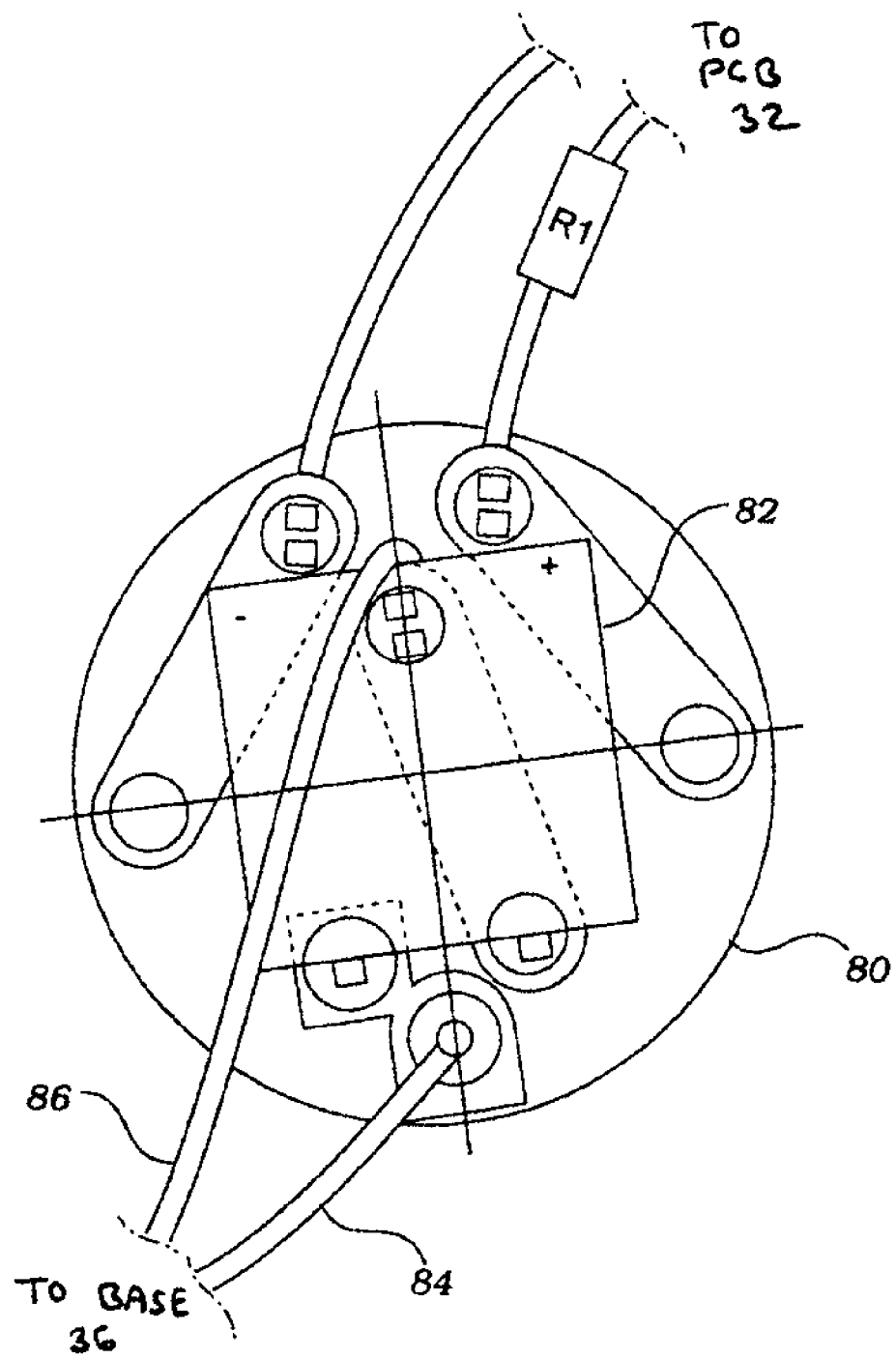
FIG. 9 is a diagram of one embodiment of the diode array PCB of FIG. 7.

FIG. 9 is a diagram of one embodiment of the diode array PCB 80 of FIG. 7. As described above, electrical power is provided to the PCB 32 shown in FIGS. 1, 6, and 7 from the base 36 of FIGS. 1–3 via the diode array PCB 80 and the resistor R1. As illustrated in FIG. 9 the bridge rectifier device 82, including the diode array 56 of FIG. 4, is mounted to the diode array PCB 80. (The MOV 54 of FIGS. 4 and 7 is not shown in FIG. 9.) As described above, the wire 84 connects the diode array PCB 80 to the shell 38 of the base 36. The diode array PCB 92 of FIG. 8 is similar to the diode array PCB 80 of FIG. 9.

Figure 10:
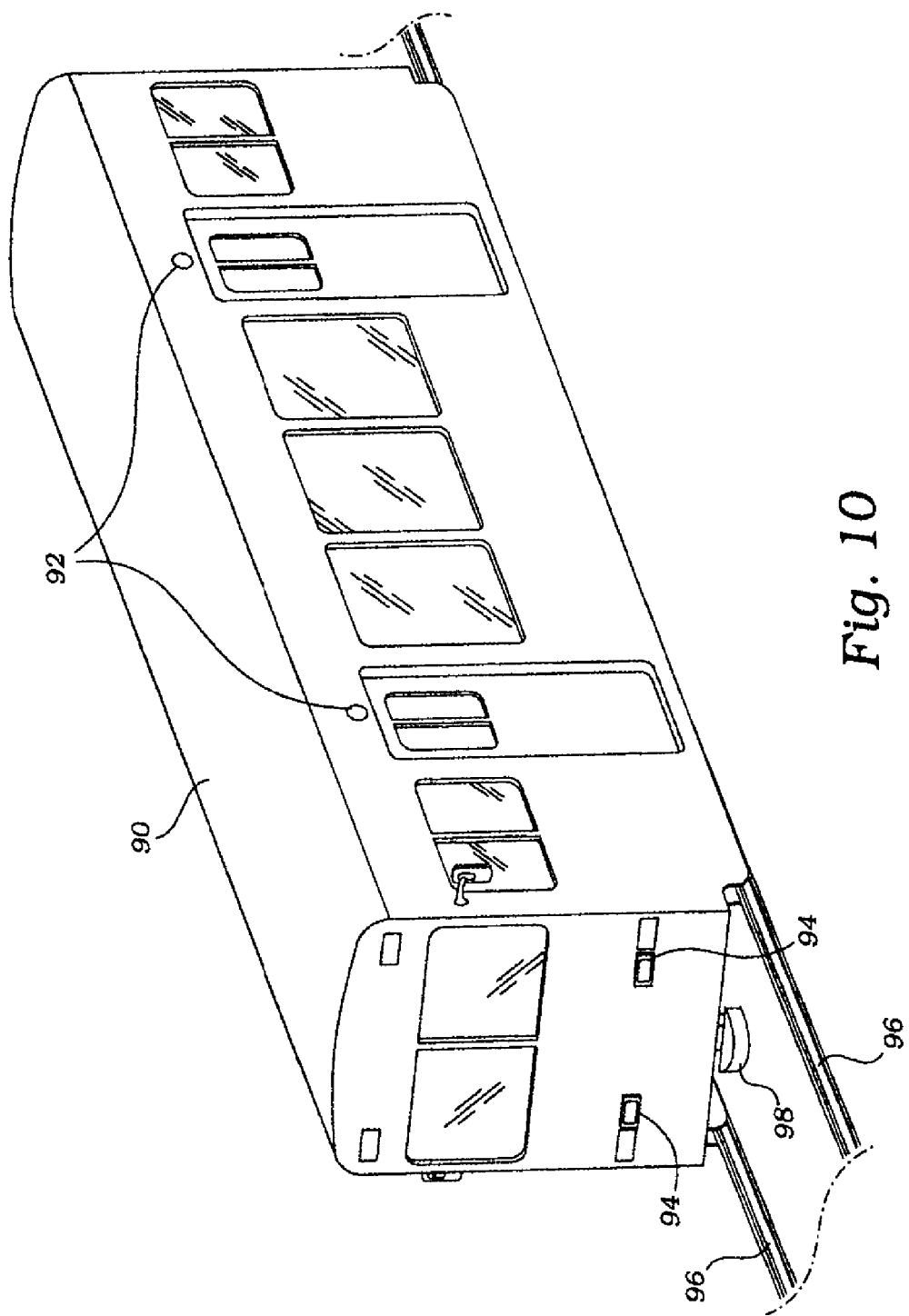
FIG. 10 is a perspective view of a light rail car having a first pair of rail car light fixtures mounted over corresponding doors on a side of the light rail car and second pair of light fixtures mounted at a front end of the light rail car.

FIG. 10 is a perspective view of a light rail car 90 having a first pair of rail car light fixtures 92 mounted over corresponding doors on a side of the light rail car 90, and second pair of light fixtures 94 mounted at a front end of the light rail car 90. Lamps of the light fixtures 92 are illuminated to indicate that the corresponding door is ajar. The lamp 20 of FIG. 1 may be used in the light fixtures 92. In this application all of the LEDs of the lamp 20 may emit blue light as described above.

The rail car 90 has wheels on opposite sides spaced a fixed distance apart. A pair of parallel metal rails 96 are spaced apart to form tracks for the wheels of the rail car 90. As is typical, the rail vehicle 90 has a coupler 98 at the front end for coupling to other rail vehicles. The rail vehicle 90 also has a similar coupler at the back end. The rail vehicle 90 may move on the rails 96 by itself, or may be coupled to one or more other rail vehicles and move on the rails 96 along with the other rail vehicles.

When the front end of the rail car 90 is facing in a primary direction of travel, the light fixtures 94 at the front end of the rail car 90 expectedly perform running light and/or turn signal functions. The lamp 20 of FIG. 1 may be used in the light fixtures 94. In this application all of the LEDs of the lamp 20 may emit yellow light as described above.

The rail vehicle 90 expectedly has a pair of light fixtures similar to light fixtures 94 mounted on a back end of the rail vehicle 90. When the front end of the rail car 90 is facing in a primary direction of travel, the light fixtures mounted on the back end of the rail car 90 expectedly perform rear tail light, brake light, and/or turn signal functions. The lamp 20 of FIG. 1 may be used in the light fixtures mounted on the back end of the rail vehicle 90. In this application all of the LEDs of the lamp 20 may emit red light as described above.

The rear tail light function may, for example, meet or exceed the requirements in SAE standard J585 "Tail Lamps (Rear Position Lamps) For Use on Motor Vehicles Less Than 2032 mm in Overall Width." The brake light function may, for example, meet or exceed the requirements in SAE standard J586 "Stop Lamps for Use on Motor Vehicles Less Than 2032 mm in Overall Width." The turn signal function may, for example, meet or exceed the requirements in SAE standard J588 "Turn Signal Lamps for Use on Motor Vehicles Less Than 2032 mm in Overall Width."

The rail car 90 may also be oriented such that the back end is facing in the primary direction of travel (e.g., when the rail car 90 is coupled behind, and being towed by, another rail vehicle). In this situation, the pair of light fixtures mounted on the back end expectedly perform the running light and turn signal functions, and the light fixtures 94 at the front end of the rail car 90 expectedly perform the rear tail light, brake light, and turn signal functions.

While the invention has been described with reference to at least one preferred embodiment, it is to be clearly understood by those skilled in the art that the invention is not limited thereto. Rather, the scope of the invention is to be interpreted only in conjunction with the appended claims.

All patents, patent applications, and other documents and printed matter cited or referred to in this application is hereby incorporated by reference in full.

What is claimed is:

1. A lamp, comprising:
   a housing having a pair of openings on opposite sides;
   a plurality of LEDs arranged to form two different LED arrays, wherein each of the LED arrays corresponds to a different one of the openings of the housing, and wherein at least a portion of each of the LED arrays is exposed through the corresponding openings;
   a pair of printed circuit boards, the LEDs of each of the LED arrays being mounted to a different one of the pair of printed circuit boards; and
   a base connected to a side surface of the housing and adapted for connecting to a lamp holder or socket.

2. The lamp as recited in claim 1 wherein the base is a bayonet base adapted for connecting to a bayonet-type lamp holder or socket.

3. A lamp, comprising:

a hollow, cylindrical housing having a first opening and a second opening on opposite sides;

a first printed circuit board positioned adjacent to the first opening and having a first plurality of LEDs mounted thereon, wherein at least a portion of the first plurality of LEDs is exposed through the first opening;

a second printed circuit board positioned adjacent to the second opening and having a second plurality of LEDs mounted thereon, wherein at least a portion of the second plurality of LEDs is exposed through the second opening; and a base connected to a side surface of the housing and adapted for connecting a lamp holder or socket.

4. A lamp comprising:

a housing having a pair of openings on opposite sides; a base being connected to a side surface of said housing and adapted for connecting to a lamp holder or socket, said base comprising a shell and a pair of contacts that form electrical contacts between the lamp and the lamp holder or socket; and a plurality of LEDs arranged to form two different LED arrays, wherein each of the LED arrays corresponds to a different one of the openings of the housing, and wherein at least a portion of each of the LED arrays is exposed through the corresponding opening.

5. A lamp, comprising:

a housing having a pair of openings on opposite sides; said housing having a base connected to a side surface of the housing and adapted for connecting to a lamp holder or socket, said housing further comprising a plurality of holes in the side surface opposite the base, and wherein at least one LED of each of the LED arrays is exposed through one of the holes; and a plurality of LEDs arranged to form two different LED arrays, wherein each of the LED arrays corresponds to a different one of the openings of the housing, and wherein at least a portion of each of the LED arrays is exposed through the corresponding opening.

6. The lamp as recited in claim 5 wherein the at least one LED is generally orthogonal to at least one of the LED arrays.

7. A lamp comprising:

a housing having a pair of openings on opposite sides;

a plurality of LEDs arranged to form two different LED arrays, wherein each of the LED arrays corresponds to a different one of the openings of the housing, and wherein at least a portion of each of the LED arrays is exposed through the corresponding opening; and an electrical circuit coupled to the LEDs of one of the LED arrays and configured to properly illuminate the LEDs independent of the polarity of an input direct current voltage.

8. The lamp as recited in claim 7 wherein the electrical circuit comprises a resistor coupled to a diode array.

9. The lamp as recited in claim 8 wherein the diode array comprises a bridge rectifier device mounted to a printed circuit board.

10. A lamp, comprising:

a hollow, cylindrical housing having a first opening and a second opening on opposite sides, a base being connected to a side surface of the housing and adapted for connecting to a lamp holder or socket, the housing further comprising a plurality of holes in the side surface opposite the base, and wherein at least one LED of the first and second pluralities of LEDs is exposed through one of the holes;

a first printed circuit board positioned adjacent to the first opening and having a first plurality of LEDs mounted thereon, wherein at least a portion of the first plurality of LEDs is exposed through the first opening; and a second printed circuit board positioned adjacent to the second opening and having a second plurality of LEDs mounted thereon, wherein at least a portion of the plurality of LEDs is exposed through the second opening.

11. The lamp as recited in claim 10 wherein the lamp is configured to emit light from the first and second openings of the housing and from the holes in the side surface of the housing opposite the base.

12. A lamp, comprising:

a hollow, cylindrical housing having a first opening and a second opening on opposite sides;

a first printed circuit board positioned adjacent to the first opening and having a first plurality of LEDs mounted thereon, wherein at least a portion of the first plurality of LEDs is exposed through the first opening;

a second printed circuit board positioned adjacent to the second opening and having a second plurality of LEDs mounted thereon, wherein at least a portion of the plurality of LEDs is exposed through the second opening; and an electrical circuit coupled to the first plurality of LEDs and configured to properly illuminate the first plurality of LEDs independent of the polarity of an input direct current voltage.

* * * * *